(12) United States Patent
Miyazawa

(10) Patent No.: US 8,586,975 B2
(45) Date of Patent: *Nov. 19, 2013

(54) PHOTOELECTRIC CONVERSION ELEMENT, METHOD FOR MANUFACTURING PHOTOELECTRIC CONVERSION ELEMENT, AND ELECTRONIC APPARATUS

(75) Inventor: Takashi Miyazawa, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/360,245

(22) Filed: Jan. 27, 2012

(65) Prior Publication Data

US 2012/0119314 A1 May 17, 2012

Related U.S. Application Data

(63) Continuation of application No. 11/624,925, filed on Jan. 19, 2007, now Pat. No. 8,129,713.

(30) Foreign Application Priority Data

Feb. 10, 2006 (JP) ................ 2006-034548

(51) Int. Cl.
*H01L 29/08* (2006.01)
*H01L 35/24* (2006.01)
*H01L 51/00* (2006.01)

(52) U.S. Cl.
USPC ............. 257/40; 257/E25.009; 257/E51.026; 257/E51.027; 257/E51.039; 257/E51.047; 257/53; 257/431

(58) Field of Classification Search
USPC ............. 257/40, 53, 431, E25.009, E51.026, 257/E51.027, E51.039, E51.047
See application file for complete search history.

(56) References Cited

U.S. PATENT DOCUMENTS

| 4,268,456 A | 5/1981 | Keim et al. |
| 4,582,772 A | 4/1986 | Teuscher et al. |
| 4,754,418 A | 6/1988 | Hara |
| 4,927,721 A | 5/1990 | Gratzel et al. |

(Continued)

FOREIGN PATENT DOCUMENTS

| JP | B-46-034898 | 10/1971 |
| JP | B-49-046291 | 12/1974 |

(Continued)

OTHER PUBLICATIONS

Krebs, F.C. et al., "Dye sensitized photovoltaic cells: Attaching conjugated polymers to zwitterionic ruthenium dyes," Solar Energy Materials & Solar Cells, vol. 90 pp. 142-165 (2006).

(Continued)

*Primary Examiner* — S. V. Clark
*Assistant Examiner* — Jesse Y Miyoshi
(74) *Attorney, Agent, or Firm* — Oliff & Berridge, PLC

(57) ABSTRACT

A photoelectric conversion element includes a first electrode, a second electrode, and a photoelectric conversion element provided between the first electrode and the second electrode. The photoelectric conversion element includes a polymer. The polymer includes at least one light absorber which absorbs light and generates at least one kind of carrier. An end part of the polymer combines with a surface, which faces the second electrode, of the first electrode.

16 Claims, 8 Drawing Sheets

(56) References Cited

U.S. PATENT DOCUMENTS

| | | | |
|---|---|---|---|
| 5,084,365 | A | 1/1992 | Gratzel et al. |
| 5,286,803 | A | 2/1994 | Lindsay et al. |
| 5,470,327 | A | 11/1995 | Helgren et al. |
| 5,470,329 | A | 11/1995 | Sumiya |
| 6,028,265 | A | 2/2000 | Ono et al. |
| 6,580,027 | B2 * | 6/2003 | Forrest et al. ............ 136/263 |
| 6,582,895 | B2 | 6/2003 | Hanaki et al. |
| 6,596,935 | B2 | 7/2003 | Lindsey et al. |
| 7,186,781 | B2 | 3/2007 | Yamamoto |
| 2002/0185173 | A1 * | 12/2002 | Lindsey et al. ............ 136/263 |
| 2003/0022106 | A1 | 1/2003 | Katano et al. |
| 2005/0000565 | A1 | 1/2005 | Zeng |
| 2005/0022856 | A1 | 2/2005 | Komatsu et al. |
| 2005/0121068 | A1 | 6/2005 | Sager et al. |
| 2005/0217722 | A1 | 10/2005 | Komatsu et al. |
| 2005/0263183 | A1 | 12/2005 | Nishikitani et al. |
| 2006/0174932 | A1 | 8/2006 | Usui et al. |

FOREIGN PATENT DOCUMENTS

| | | |
|---|---|---|
| JP | A-51-030284 | 3/1976 |
| JP | A-55-011525 | 1/1980 |
| JP | A-62-034947 | 2/1987 |
| JP | A-62-104802 | 5/1987 |
| JP | A-62-221431 | 9/1987 |
| JP | B-01-024142 | 5/1989 |
| JP | B2-01-24142 | 5/1989 |
| JP | A-01-220380 | 9/1989 |
| JP | B-04-065824 | 10/1992 |
| JP | A 2002-175844 | 6/2002 |
| JP | A-2003-031832 | 1/2003 |
| JP | A-2004-146663 | 5/2004 |
| JP | 2006-019189 * | 1/2006 |
| JP | A-2006-019189 | 1/2006 |
| WO | WO 2005/006482 A1 | 1/2005 |

OTHER PUBLICATIONS

Feb. 3, 2012 Office Action issued in U.S. Appl. No. 12/792,464.

Nazeeruddin et al., "Synthesis of novel ruthenium sensitizers and their application in dye-sensitized solar cells," vol. 249 No. 13-14, Apr. 18, 2005, pp. 1460-1467.

Renouard T. et al, "Functionalized tetradentate ligands for Ru-sensitizedsolar cells," vol. 57 No. 38, Sep. 17, 2001, pp. 8145-8150.

Wang, P. et al., "Stable new sensitizer with improved light harvesting for nanocrystalline dye-sensitized solar cells," vol. 16 No. 20, Oct. 18, 2002, pp. 1806-1811.

* cited by examiner

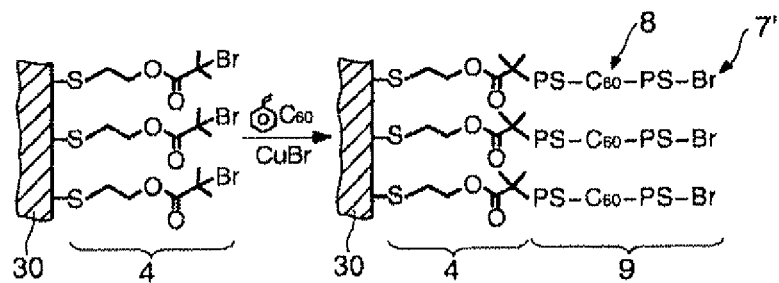
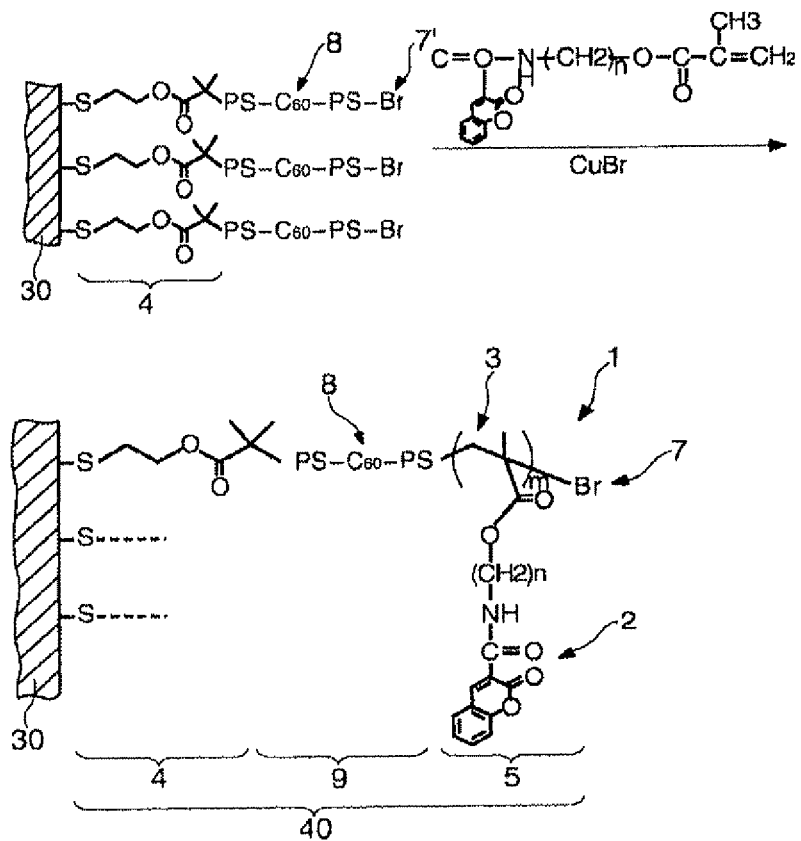
FIG. 9

PHOTOELECTRIC CONVERSION ELEMENT, METHOD FOR MANUFACTURING PHOTOELECTRIC CONVERSION ELEMENT, AND ELECTRONIC APPARATUS

This is a Continuation of application Ser. No. 11/624,925 filed Jan. 19, 2007, which claims the priority to Japanese Patent Application No. 2006-034548 filed Feb. 10, 2006. The disclosure of the prior applications is hereby incorporated by reference herein in their entirety.

BACKGROUND

1. Technical Field

The present invention relates to a photoelectric conversion element, a method for manufacturing a photoelectric conversion element, and an electronic apparatus.

2. Related Art

Photoelectric conversion elements using silicon, so-called solar cells conventionally have attracted attentions as an environmentally-friendly power source. Though solar cells using silicon include a single-crystalline solar cell to be used for an artificial satellite and the like, a polycrystalline silicon solar cell and an amorphous silicon solar cell have come into commercial and household use for practical purposes.

However, such silicon solar cells usually need high production cost and much energy for manufacturing, so that they have not necessarily been energy-saving power sources.

A dye-sensitized solar cell is proposed as a next-generation solar cell developed as an alternative to above solar cells, as an example of JP-A-2002-175844. The dye-sensitized solar cell needs low cost and low energy for manufacturing thereof.

However, since the dye-sensitized solar cell has a structure that dye simply adsorbs to a semiconductor layer, there is such a problem that generated electrons (carriers) can not efficiently be transferred and taken out to an external circuit.

SUMMARY

An advantage of the present invention is to provide a photoelectric conversion element, a method for manufacturing a photoelectric conversion element, and an electronic apparatus. The photoelectric conversion element provides a high photoelectric conversion. In the method, the photoelectric conversion element can be manufactured in a simple process, in a manner that variations of each element are suppressed. The electronic apparatus includes the photoelectric conversion element and has high reliability.

The present invention achieves as follows.

A photoelectric conversion element according to a first aspect of the invention includes a first electrode, a second electrode, and a photoelectric conversion element provided between the first electrode and the second electrode. The photoelectric conversion element includes a polymer. The polymer includes at least one light absorber which absorbs light and generates at least one kind of carrier. An end part of the polymer combines with a surface, which faces the second electrode, of the first electrode.

In the above photoelectric conversion element, the polymer including the light absorber combines with the first electrode, so that a carrier generated in the light absorber can transfer rapidly to the first electrode, providing a photoelectric conversion element by which a high photoelectric conversion rate can be obtained.

In the photoelectric conversion element, the polymer may include the light absorber on a side chain branching from a main chain.

The polymer including the light absorber on the side chain thereof can control a polymerization with relative ease, and control a number of the light absorbers included in the polymer to some extent. Therefore, the photoelectric conversion rate can be made as desired.

In the photoelectric conversion element, the light absorber may include a coumarin skeleton.

A compound including the coumarin skeleton is generally robust and relatively stable in a scientific manner, providing a photoelectric conversion element which has an excellent durable number and the like.

In the photoelectric conversion element, the polymer preferably includes at least one carrier mediating part on a position closer to the first electrode compared to the light absorber. The carrier mediating part mediates a transfer of a carrier generated in the light absorber to the first electrode.

Selecting the carrier mediating part appropriately makes it possible to control a transfer rate of a carrier from the light absorber to the first electrode and a reverse transfer rate of a carrier from the first electrode.

In the photoelectric conversion element, a part of a main chain of the polymer may work as the carrier mediating part.

Using a part of the main chain of the polymer as the carrier mediating part makes it possible also to use an interaction through a bond to the carrier transfer (through-bond interaction), enabling the carrier to transfer more rapidly and more reliably to the first electrode.

In the above photoelectric conversion element, the carrier mediating part preferably includes a fullerene skeleton.

Since the fullerene skeleton has an excellent electron-accepting property, the polymer works as a cascade electron transfer system. The carrier can transfer rapidly from the light absorber to the first electrode and a reverse electron transfer from the first electrode can be suppressed. Therefore, a longer operating life in a charge-separated state can be expected.

In addition, the fullerene skeleton included in the carrier mediating part can absorb light and generate a carrier, as well.

A method for manufacturing a photoelectric conversion element according to a second aspect of the invention includes a) supporting a first part included in a photoelectric conversion layer on a first electrode, and b) forming a second part bonded to at least one part of the first part and included in the photoelectric conversion layer. The photoelectric conversion element includes the photoelectric conversion layer between the first electrode and a second electrode.

Therefore, photoelectric conversion elements can be Manufactured in a simple process in a manner suppressing variations of each element.

In the method, at least one of the first part and the second part preferably includes at least one light absorber which absorbs light and generate a carrier.

Therefore, for example, if the first part includes at least one carrier mediating part mediating a carrier generated in the light absorber to the first electrode, the carrier can transfer very rapidly to the first electrode, improving the photoelectric conversion rate.

In the method, it is preferable that a third part combining with a surface of the first electrode interpose between the first part and the first electrode, and the first part be supported on the first electrode by interposing the third part.

Therefore, for example, by selecting a structure of the third part appropriately, a polymer (polymer molecule) combining with the surface of the first electrode can be easily synthesized by a living polymerization.

In the method, at least one of the first part and the second part is preferably formed by a polymerization of a monomer.

Therefore, a photoelectric conversion element can be manufactured in a simpler process.

In the method, it is preferable that the step b) include carrying out a living polymerization of a monomer, a growth end to react with the monomer be regenerated during the living polymerization, and the growth end be boded with a substituent group included in the first part provided in the step a).

In a living polymerization, since the growth end is regenerated and bonded with a polymerization activity part of a monomer in a growth process of the polymer, the monomer is consumed. If a monomer is newly added after the polymerization reaction stops, the polymerization reaction further progresses. Therefore, a degree of polymerization of the polymer to be synthesized can be controlled precisely by changing a quantity of monomers provided to the reaction system, being able to control appropriately the number of the light absorber and the like included in the polymer. In addition, since the polymer of which the degree of polymerization is uniform can be obtained, the number of the light absorber and the like included in the polymer can be made approximately uniform in each face in the photoelectric conversion layer to be formed, or in each element. Therefore, a photoelectric conversion layer having a desired photoelectric conversion rate can be provided in a simple process while suppressing variations of each element.

An electronic apparatus according to a third aspect of the invention includes a photoelectric conversion element according to the invention.

Accordingly, an electronic apparatus with high reliability can be provided.

BRIEF DESCRIPTION OF THE DRAWINGS

The invention will be described with reference to the accompanying drawings, wherein like numbers reference like elements.

FIG. 8 is a schematic view for describing another example of a method for manufacturing a photoelectric conversion element.

FIG. 9 is a schematic view for describing yet another example of a method for manufacturing a photoelectric conversion element.

DESCRIPTION OF EXEMPLARY EMBODIMENTS

Exemplary embodiments of a photoelectric conversion element, a method for manufacturing a photoelectric conversion element, and an electronic apparatus according to the present invention will now be described with reference to the accompanying drawings.

First Embodiment

An example of a photoelectric conversion element according to a first embodiment of the invention will be first described.

Figure 1:
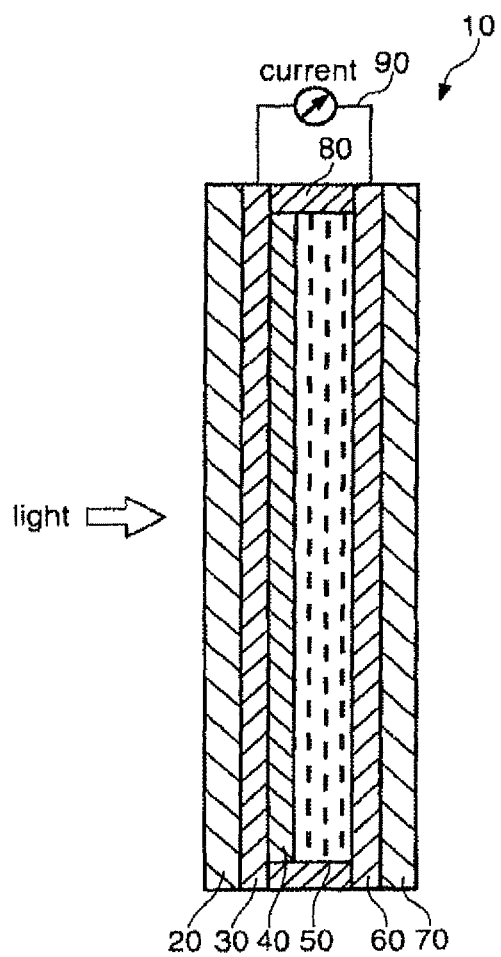
FIG. 1 is a sectional view schematically showing an example of a photoelectric conversion element according to the invention.
Figure 3:
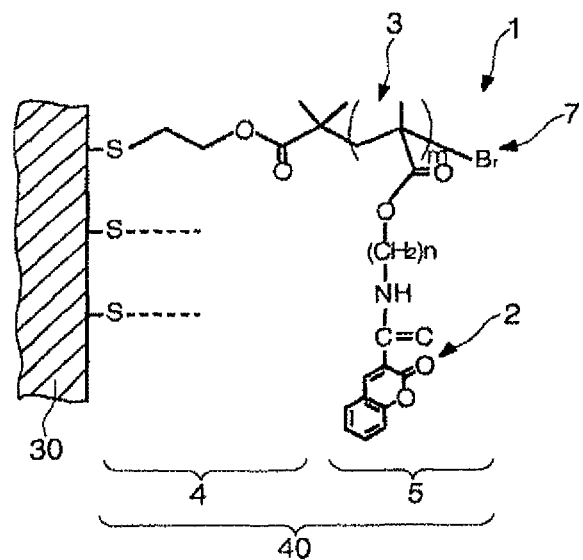
FIG. 3 is a schematic view showing an example of a photoelectric conversion layer of FIG. 2.
Figure 4:
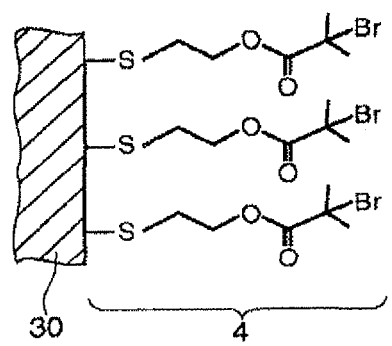
FIG. 4 is a schematic view for describing a method for manufacturing the photoelectric conversion element of FIG. 1.
Figure 5:
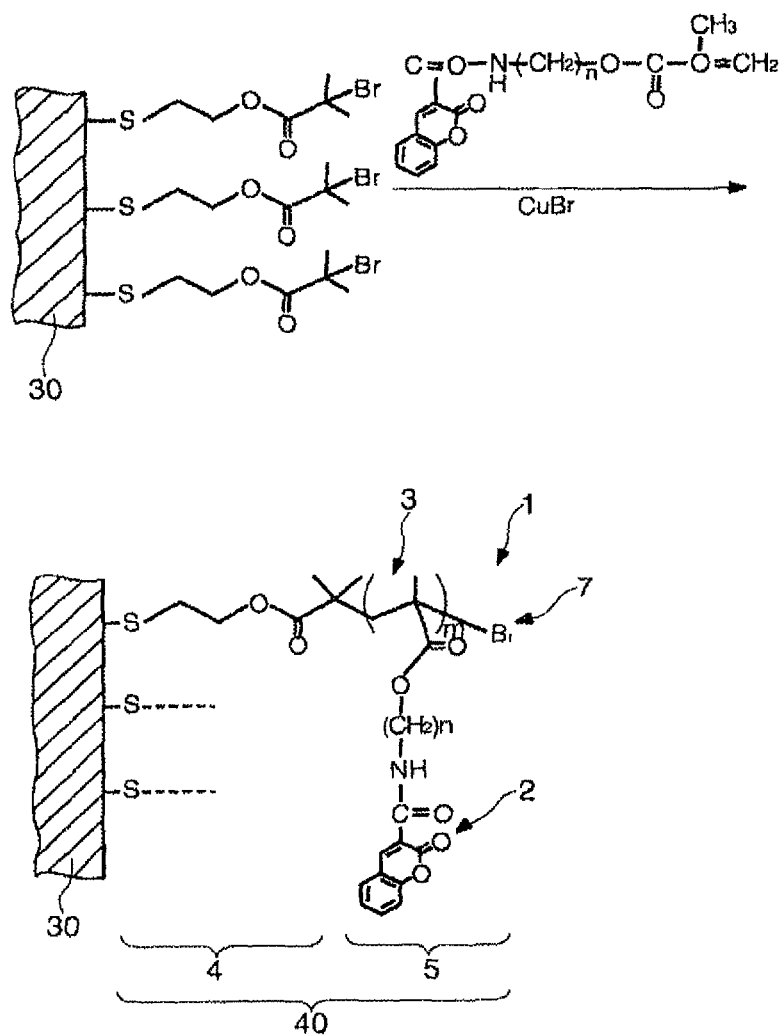
FIG. 5 is a schematic view for describing a method for manufacturing the photoelectric conversion element of FIG. 1.

FIG. 1 is a sectional view schematically showing an example of a photoelectric conversion element of the invention. FIG. 2 is a schematic view showing a photoelectric conversion layer included in the photoelectric conversion element of FIG. 1. FIG. 3 is a schematic view showing an example of the photoelectric conversion layer of FIG. 2. Each of FIGS. 4 and 5 is a schematic view for describing a method for manufacturing the photoelectric conversion element of FIG. 1.

A photoelectric conversion element 10 shown in FIG. 1 includes a first substrate 20 provided with a first electrode 30 and a second substrate 70 provided with a second electrode 60 which faces the first electrode 30, a photoelectric conversion layer 40 provided between the first electrode 30 and the second electrode 60, and an electrolyte layer 50 provided on a face of the second electrode 60. The photoelectric conversion layer 40 is disposed between the first electrode 30 and the electrolyte layer 50, and the electrolyte layer 50 is disposed between the photoelectric conversion layer 40 and the second electrode 60. Then, an outer periphery of the photoelectric conversion layer 40 and the electrolyte layer 50 is sealed by a sealing part 80. Each component will now be described sequentially.

The photoelectric conversion element 10 of the embodiment is used by making light, for example solar light and the like, incident (being irradiated by light) on the side of the first substrate 20 (the left side in FIG. 1), as shown in FIG. 1.

Therefore, it is preferable that each of the first substrate 20 and the first electrode 30 have enough transmission to incident light or light to be utilized for a photoelectric conversion, that is, be substantially transparent to the same. Therefore, light can efficiently reach the photoelectric conversion layer 40.

Examples of material of the first substrate 20 may include: resin materials such as glass, ceramics, polycarbonate (PC), and polyethylene terephthalate (PET), and other materials.

An average thickness of the first substrate 20 is set appropriately depending on material thereof, a use of the photoelectric conversion element 10, and the like, and it is not particularly limited. However, in case of the first substrate 20 made of hard material, an average thickness thereof is preferably about 0.1 to 1.5 mm, more preferably about 0.8 to 1.2 mm. In case of the first substrate 20 made of flexible material, an average thickness thereof is preferably about 0.5 to 150 µm, more preferably about 10 to 75 µm.

The first electrode 30 is provided to the inner face of the first substrate 20. The first electrode 30 receives an aftermentioned carrier (an electric charge) generated in the photoelectric conversion layer 40 and transfers it to an external circuit 90 coupled thereto. In the present embodiment, the carrier is assumed to be an electron as an example.

Examples of material (conductive material) of the first electrode 30 may include: oxide materials such as indium tin oxide (ITO), fluorine-doped tin oxide (FTO), indium oxide (IO), and, tin oxide ($SnO_2$); and metal materials such as platinum, silver, gold, copper, or their alloys; and the like. They may be used singly or in combination (e.g., as a multilayer structure of multiple layers).

An average thickness of the first electrode 30 is set appropriately depending on material thereof, a use of the photoelectric conversion element 10, and the like, and it is not particularly limited. However, in case of the first electrode 30 made of oxide material (transparent conductive material), an average thickness thereof is preferably about 0.05 to 5 μm, more preferably about 0.1 to 1.5 μm. In case of the first electrode 30 made of metal material, an average thickness thereof is preferably about 0.01 to 1 μm, more preferably about 0.03 to 0.1 μm.

The first electrode 30 can be composed of a multilayered body laminating a conductive layer made of the above conductive material and a semiconductor layer made of semiconductor material. The conductive layer is on the side facing the first substrate 20, and the semiconductor layer is on the side facing the photoelectric conversion layer 40.

In this case, examples of semiconductor material may include oxide semiconductor materials such as $TiO_2$, $ZrO_2$, ZnO, $Al_2O_3$, $SnO_2$, $ScVO_4$, $YVO_4$, $LaVO_4$, $NdVO_4$, $EuVO_4$, $GdVO_4$, $ScNbO_4$, $ScTaO_4$, $YNbO_4$, $YTaO_4$, $ScPO_4$, $ScAsO_4$, $ScSbO_4$, $ScBiO_4$, $YPO_4$, $YSbO_4$, $BVO_4$, $AlVO_4$, $GaVO_4$, $InVO_4$, $TlVO_4$, $InNbO_4$, and $InTaO_4$; sulfide semiconductor materials such as ZnS, and CdS; selenide semiconductor materials such as CdSe; carbide semiconductor materials such as TiC, and Sic; nitride semiconductor materials such as BN, and $B_4N$; and the other.

The photoelectric conversion layer 40 is provided to the inner face of the first electrode 30 (the face facing the second electrode 60).

Figure 2A:
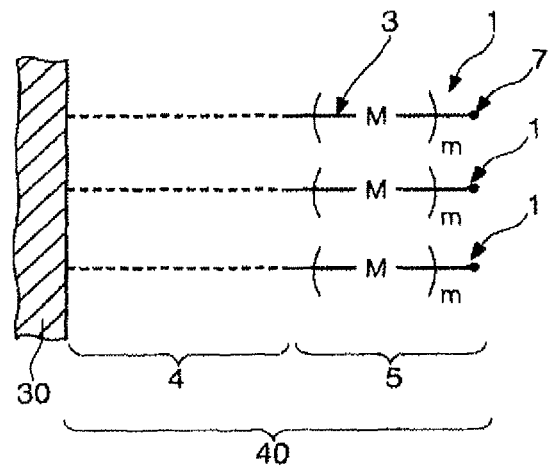
FIG. 2 is a schematic view of a photoelectric conversion layer included in the photoelectric conversion element of FIG. 1.

As shown in FIG. 2A, the photoelectric conversion layer 40 is composed of a plurality of polymer molecules 1, individually including a plurality of structure units 3. The polymer molecules 1 are important for converting light energy into electrical energy (photoelectric conversion). In the polymer molecules 1, a light absorber 2 absorbs light (stimulated optically by light irradiation) and generates a carrier such as an electron or an electron hole. Then, the generated carrier transfers to the second electrode 60 via the first electrode 30 or the electrolyte layer 50, generating electric current.

Figure 2B:
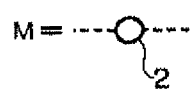
Figure 2C:
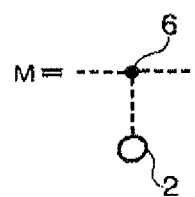

The following structure unit 3 can be used; a structure unit 3 in which a light absorber 2 absorbing light and including a chromophore and the like, is incorporated to a main chain of the polymer molecule 1, as shown in FIG. 2B, or, a structure unit 3 in which a side chain branching from a branching part 6 includes a light absorber 2 absorbing light and including a chromophore and the like, as shown in FIG. 2C. The branching part 6 is a part of the main chain skeleton, and is a place where a side chain branches.

A dashed line shown in FIG. 2B shows expediently a part of a bonding group lying between a light absorber 2 included in a first structure unit 3 and a light absorber 2 included in a second structure unit 3 adjacent to the first structure unit 3. The dashed line and the light absorber 2 are included in at least a part of the main chain of the polymer molecule 1 having the structure unit 3 shown in FIG. 2B.

A dashed line shown in FIG. 2C shows expediently a bonding group lying between a branching part 6 included in a first structure unit 3 and a branching part 6 included in a second structure unit 3 adjacent to the first structure unit 3. The dashed line and the branching part 6 are included in at least a part of the main chain of the polymer molecule 1 having the structure unit 3 shown in FIG. 2C.

In a case where the photoelectric conversion element 10 mentioned above is used as a solar cell, examples of chromophores included in the light absorber 2 may include coumarin dye, cyanogen dye, xanthene dye, azole dye, chlorophyll dye, porphyrin compound, phthalocyanine compound, cyanin dye, anthraquinone dye, and polycyclic quinone dye; metal complexes such as ruthenium complex, iron complex, osmium complex, copper complex, and platinum complex; and the like. They absorb visible light. They may be used singly or in combination.

Since the above dyes generally have a robust molecule structure, as shown in FIG. 2B, the polymer molecule 1 including a light absorber 2 on a part of the main chain thereof has rigidity, and there are few variations in a structure or a conformation of the polymer molecule 1. Hence, distances between one light absorber 2 and another light absorber 2 included in the main chain can be relatively uniformed. Therefore, the polymer molecule 1 has such advantage that electron-transfer efficiency reliant on a distance between light absorbers 2 is relatively easy to control.

In addition, if the polymer molecule 1 shown in FIG. 2B has enough rigidity, it can suppress an excessive increase of the light absorbers 2 in the ground state or a formation of excited complexes of the light absorbers 2, potentially achieving good electron-transfer efficiency.

On the other hand, in a case where the polymer molecule 1 has a light absorber 2 on the side chain thereof like FIG. 2C, since the main chain has flexibility, the polymer molecule 1 has relatively many variations of a structure or a conformation. However, if a structure of the structure unit 3 having the light absorber 2 is selected appropriately, distances between the light absorbers 2 can be controlled.

Further, since the main chain of the polymer molecule 1 shown in FIG. 2C generally includes a flexible organic group such as a methylene group and the like, it has a relatively high solubility. In case of synthesizing by using a polymerization reaction in a solvent, polymers having uniform molecular weight with high molecular mass can be obtained with relative ease by using after-mentioned living polymerizations such as an atom transfer radical polymerization, a living anionic polymerization, a living cationic polymerization, and the like.

The photoelectric conversion layer 40 is configured by supporting a plurality of polymer molecules 1 on one face, facing the second electrode 60, out of two principle faces of the first electrode 30. Each of the polymer molecules 1 includes at least one light absorber 2. Here, an end of the polymer molecule 1 is bound to the one principle face of the first electrode 30.

With increasing a number of the light absorbers 2 included in the polymer molecule 1, a collection efficiency of light improves. On the other hand, the increase of the light absorbers 2 also brings phenomena commonly causing an efficiency reduction of a carrier transfer such as an excessive increase of the light absorbers 2, a formation of excited complexes, or the like, as mentioned above. Therefore, the number of light absorbers 2 included in the polymer molecule 1 is selected properly with consideration for a desired photoelectric conversion rate and the like. For example, in a polycyclic π electron compound such as a coumarin dye, a porphyrin compound, or the like, the number of light absorbers 2 is preferably 5 to 20. In particular, a polymer molecule 1 preferably includes 5 to 20 structure units 3 (indicating a number of "m" in FIG. 2A).

Examples of a bonding pattern between the polymer molecule 1 and the first electrode 30 may include chemical bonds such as a covalent bond, an ionic bond, a hydrogen bond and the like; electrostatic bonds; and the like. In case of forming a strong bond between the first electrode 30 and the polymer molecule 1, a covalent bond is particularly used as a bonding pattern. Hence, the polymer molecule 1 can be got close to the first electrode 30 spatially, efficiently generating a carrier transfer between the polymer molecule 1 and the first electrode.

In addition, the polymer molecule 1 may bond a repetition part (hereinafter, referred to as "photoelectric converting part 5") of the structure unit 3 having the light absorber 2 to the inner surface of the first electrode 30 directly, or bond it to the inner surface of the first electrode 30 via the connecting part (connecting structure) 4, as shown in FIG. 2A.

The connecting part 4 can be obtained, for example, by contacting a solution including a first compound to the first electrode 30. The first compound includes a first functional group and a second functional group. The first functional group reacts to combine with the surface of the first electrode 30. The second functional group is bonded to a monomer molecule or a polymer molecule to be material of the photoelectric converting part 5. By forming such the connecting part 4, the polymer molecule 1 combining with the surface (inner face) of the first electrode 30 can easily be synthesized by after-mentioned living polymerization in a manner making the second functional group, included in the first compound, a base point (a starting point of the polymerization reaction).

Here, a type of the first compound and a method for forming the connecting part 4 will be described in a description of after-mentioned method for manufacturing a photoelectric conversion element 10.

Concrete examples of the polymer molecule 1 having such the connecting part 4 and the photoelectric converting part 5 may include the one shown in FIG. 3.

Moreover, the polymer molecule 1 may include a structure having various types of substituent group. Examples of the substituent group may include, but not be limited to, a saturated chain hydrocarbon group, a saturated ring hydrocarbon group, and the like.

An adsorbed amount of the polymer molecules 1 to the first electrode 30 is not limited. However, if the adsorbed amount is too small, a light collecting amount of the photoelectric conversion layer 40 in itself decreases. On the other hand, if the adsorbed amount is too large, distances between the polymer molecules 1 gets close, generating an excessive increase or a formation of an excited complex of the light absorbers 2. Therefore, an adsorbed amount of the polymer molecules 1 is typically set in a range about 0.2 to 3.0 $nmol/cm^2$, more typically about 0.7 to 1.6 $nmol/cm^2$.

The electrolyte layer 50 is formed at the face, opposite to the first electrode 30, of the photoelectric conversion layer 40 so as to contact with both of the second electrode 60 and the photoelectric conversion layer 40 (between the second electrode 60 and the photoelectric conversion layer 40). The electrolyte layer 50 is composed of electrolytic compositions. Examples of electrolyte used for electrolytic compositions may include, but not be limited to, halogens such as $I/I_3$, $Br/Br_3$, $Cl/Cl_3$, and $F/F_3$; quinone/hydroquinone; ascorbic acid; and the like. They may be used singly or in miscible. Among these, $I/I_3$ is particularly preferable as an electrolyte.

Concrete examples of $I/I_3$ electrolyte may include a combination of $I_2$ with metal iodides such as LiI, NaI, KI, CsI, and $CaI_2$; or with iodide salts of quaternary ammonium compound such as tetraalkylammonium iodide, pyridinium iodide, and imidazolium iodide; and the like.

Examples of solvent to be used for preparing an electrolyte composition may include various waters; nitriles such as acetonitrile, propionitrile, and benzonitrile; carbonates such as ethylene carbonate, and propylene carbonate; polyhydric alcohols such as polyethylene glycol, polypropylene glycol, and glycerine; propylene carbonates; and the like. They may be used singly or in mixed. Using these solvents provides an electrolyte layer 50 having excellent ion conductivity.

The concentration of whole electrolyte in an electrolyte composition is preferably, but not be limited to, about 0.1 to 25 wt %, more preferably about 0.5 to 5 wt %.

Further, the electrolyte layer 50 may be liquid or gelled. Adding a gelling agent to the above electrolyte composition can make the electrolyte layer 50 gelled.

The second electrode 60 bonded to the second substrate 70 is provided to the face, opposite to the photoelectric conversion layer 40, of the electrolyte layer 50.

Examples of material of the second electrode 60 may include: metals such as aluminum, nickel, cobalt, platinum, silver, gold, copper, molybdenum, titanium, tantalum, or their alloys; carbon materials such as graphite; and the like. They may be used singly or in combination.

The same materials as the one of the first substrate 20 mentioned above may be used as material of the second substrate 70.

An average thickness of the second electrode 60 and the same of the second substrate 70 may also be the same as the one of the first electrode 30 and the one of the first substrate 20 respectively, though it is set appropriately depending on the materials thereof or a use of the photoelectric conversion element 10 and is not limited.

A sealing part 80 is provided between the first electrode 30 and the second electrode 60 in a manner surrounding an outer periphery of the photoelectric conversion layer 40 and the electrolyte layer 50. Therefore, even if the electrolyte layer 50 is liquid, the electrolyte layer 50 can be prevented from flowing out or vaporizing from the photoelectric conversion element 10, or moisture or the like can be prevented from infiltrating the photoelectric conversion element 10.

Examples of material of the sealing part 80 may include epoxy adhesive, urethane adhesive, acrylic adhesive, rubber adhesive, and the like.

If light enters such the photoelectric conversion element 10, electron holes or electrons are generated at the photoelectrical conversion layer 40 (light absorbers 2). Electrons (e) transfer to the first electrode 30 and the electron holes transfer to the second electrode 60 from the photoelectrical conversion layer 40, generating a potential difference (photovoltaic power) between the first electrode 30 and the second electrode 60. Thus, current (light excitation current) flows to an external circuit 90.

Such the photoelectric conversion element 10 can be manufactured as follows, for example.

(1A) First, the first substrate 20 and the second substrate 70 are prepared, and the first electrode 30 and the second electrode 60 are formed on surfaces of the first substrate 20 and the second substrate 70 respectively.

Each of the first electrode 30 and the second electrode 60 can be formed, for example, by vapor-phase process using vapor deposition, sputtering, and the like, or by liquid-phase process using printing, or the like.

(2A) Next, on the surface of the first electrode 30, the photoelectric conversion layer 40 is provided.

Here illustrates a case of providing the photoelectric conversion layer 40 composed of the polymer molecules 1 shown in FIG. 2.

(2A-1) The connecting part 4 is provided by contacting a solution including a first compound having a first functional group and a second functional group to the first electrode 30 (first process). The first functional group reacts to combine with the surface of the first electrode 30. The second functional group is bonded to a monomer molecule or a polymer molecule to be material of the photoelectric converting part 5.

For example, since a carrier transfer speed to the first electrode 30 or a reverse carrier transfer speed from the first electrode 30 can be controlled by a number of carbon included in the connecting part 4, the carrier transfer speed and the reverse carrier transfer speed can be set appropriately by controlling the number of carbon of the connecting part 4 properly. Typically, the number of carbon of the connecting part 4 is preferably about 2 to 25, more preferably 4 to 15.

Examples of the first functional group may include a thiol group, a sulfonate group, a carboxyl group, an amino group, a phosphate group, a cyano group, a halogen group, an alkoxysilyl group, a halogenated silyl group, a nitro group, an aldehyde group, and the like.

As a matter of course, the first functional group may be, for example, a functional group electrostatic-bonding or hydrogen-bonding to the surface of the first electrode 30.

On the other hand, examples of the second functional group included in the first compound may include a hydroxyl group, a carboxyl group, a halogen group, an amino group, an aldehyde group, a nitro group, a sulfone group, a carbonyl group, and the like.

The connecting part 4 shown in FIG. 4 is provided on the surface of the first electrode 30 by allowing a compound expressed in a formula (1) to act on the first electrode 30. The compound includes, for example, a thiol group as the first functional group and a bromine group as the second functional group.

Chemical Formula 1

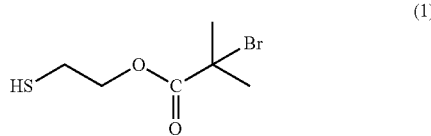

(1)

Here, examples of methods for contacting the solution including the first compound to the surface of the first electrode 30 may include I) dipping the first electrode 30 in the solution (dipping method); II) applying the solution to the surface of the first electrode 30 (application method); III) providing the solution to the surface of the first electrode 30 like a shower (spraying method); IV) adsorbing the first compound to the first electrode 30 by vaporizing the first compound in a manner that the first electrode 30 and the first compound are located in a chamber (vaporization and adsorption method); and the like.

Examples of a solvent to prepare the solution may include water, methanol, ethanol, isopropyl alcohol, acetonitrile, ethyl acetate, ether, methylene chloride, N-methyl-2-pyrrolidone (NMP), and the like. They may be used singly or in combination.

In case of using the dipping method, the solution including the first compound may be irradiated with ultrasound as necessary. This enables the compound to adsorb to the surface of the first electrode 30 rapidly.

(2A-2) A monomer including the light absorber 2 is polymerized by living polymerization (especially, atom transfer radical polymerization: ATRP) so as to provide the photoelectric converting part 5 on an end, opposite to the first electrode 30, of the connecting part 4 (second process). This process provides (synthesizes) the polymer molecule 1.

The living polymerization can be carried out by contacting a solution to the surface of the first electrode 30 combining with the connecting part 4. The solution includes a monomer having the light absorber 2, and a catalyst.

First, a monomer including the light absorber 2 is prepared. Examples of a polymerized group included in the monomer may include unsaturated bonding groups such as a vinyl group, and a (meta)acrylyl group; cyclic ether groups such as a epoxy group, and an oxetane ring; and the like. The monomer may be selected appropriately depending on a desired characteristic, a reaction condition or the like.

Concrete examples of such the monomer may include the one expressed in the following formula (2).

Chemical Formula 2

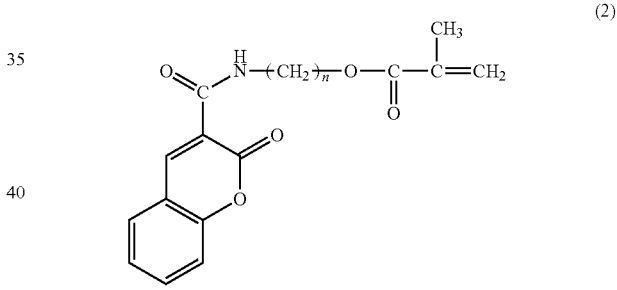

(2)

"n" in the formula (2) preferably indicates an integer number from 1 to 10, more preferably from 2 to 8. By selecting n properly, distances between the light absorbers 2 can be controlled to a certain extent.

The monomer expressed by the formula (2) can be synthesized by the following synthetic route, for example.

Chemical Formula 3

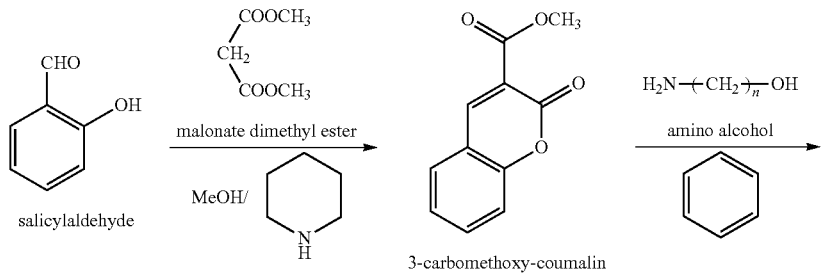

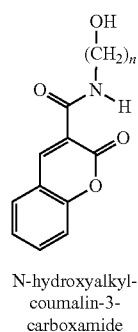

N-hydroxyalkyl-coumalin-3-carboxamide

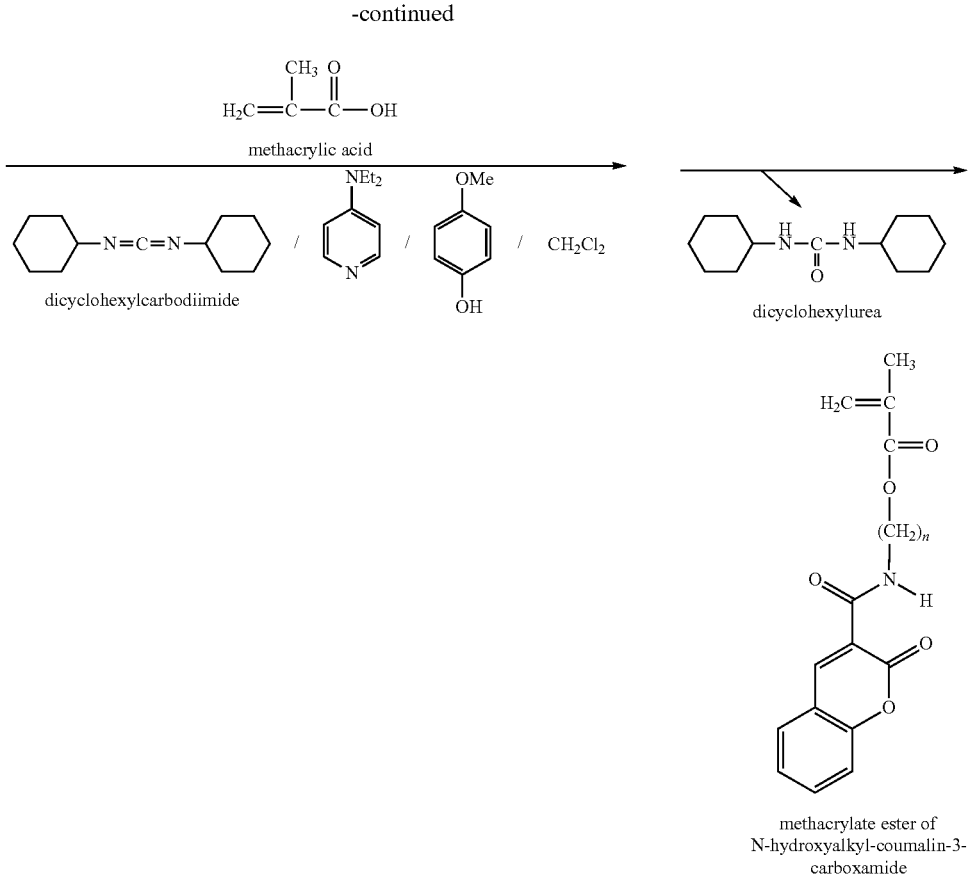

First, salicylaldehyde is allowed to react with malonate dimethyl ester so as to obtain 3-carbomethoxy-coumalin.

Specifically, after a molar equivalent of malonate dimethyl ester, a predetermined quantity of methanol, and a predetermined quantity of piperidine are added to salicyladldehyde and it is left at room temperature, the solvent is removed. Then it is purified by silica gel chromatography.

After that, the obtained 3-carbomethoxy-coumalin is allowed to react with amino alcohol so as to obtain N-hydroxyalkyl-coumalin-3-carboxamide.

In particular, 3-carboxamide-coumalin and amino alcohol are added to a predetermined quantity of benzene, and then it is refluxed while being agitated. After finishing the reflux, it is crystallized by cooling down and adding a crystal seed. Furthermore it is recrystallized repeatedly with a use of a predetermined solvent.

Next, the obtained N-hydroxyalkyl-coumalin-3-carboxamide is allowed to react with methacrylic acid and dicyclohexylcarbodiimide so as to obtain methacrylate ester of N-hydroxyalkyl-coumalin-3-carboxamide.

In particular, 4-diethylaminopyridine, 4-methoxyphenol, and methylene dichloride are added to N-hydroxyalkyl-coumalin-3-carboxamide, and fused. Then, after methylene dichloride solution of methacrylic acid and methylene dichloride solution of dicyclohexylcarbodiimide are added to the solution and it is left at room temperature, generated dicyclohexylurea is removed by filtration or the like. Then, after the solvent is removed from the filtrate, it is dissolved in a predetermined quantity of benzene and cyclohexane and is left. Then, after sellite is added and agitated, the sellite is removed by filtrating or the like. After the filtrate is cooled down, the supernatant is removed and a resulting residue is suspended in a predetermined solvent. Then the suspension is left at room temperature. During this period, generated crystal is collected and recrystallized with a use of a predetermined solvent.

These processes provide the monomer expressed in the formula (2).

On the other hand, a catalyst which is used is the one which can regenerate a growth end 7 and does not react at all or a little to the light absorber 2. Examples of typical compounds as such catalysts may include a compound coordinating halogen atoms in a transition metal; or a transition metal complex coordinating atoms of nitrogen in bjipyridine, an amino group, or the like, or atoms of phosphorous in triphenylphosphine as well as halogen atoms in a transition metal; and the like.

Examples of solvents for preparing the above solution may include waters; alcohols such as methanol, ethanol, or butanol; halogenated aromatic hydrocarbons such as o-dichlorobenzene; ethers such as diethyl ether, or the like; and the like. They may be used singly or in mixed.

For example, by using a compound expressed by the formula (2) as a monomer, and CuBr as a catalyst, the photoelectric converting part 5 having the growth end 7 being active can be provided to the end part opposite to the first electrode 30, as shown in FIG. 5.

Herein, in a living polymerization, since the growth end 7 is regenerated and bonded to the vinyl group which is a polymerization activity part of a monomer in a growth process of the polymer molecule 1, the monomer is consumed. Therefore, if a monomer is newly added after a polymerization reaction stops, a polymerization reaction further progresses.

Accordingly, a degree of polymerization of the polymer molecule 1 to be synthesized can be controlled precisely by changing a quantity of monomers to be provided to the reaction system, being able to control appropriately the number of the light absorbers 2 included in the polymer molecule 1.

In addition, since the polymer molecules 1 of which the degree of polymerization is uniform can be obtained, the number of the light absorbers 2 included in the polymer molecules 1 can be made approximately uniform on the face of the photoelectric conversion layer 40 or in each element.

Therefore, the photoelectric conversion layer 40 having a desired photoelectric conversion rate can be provided in a simple process while suppressing variations of each element.

Further, it is preferable that the above solution (reaction liquid) be deoxidized before the polymerization reaction starts. Examples of deoxidizations may include a substitution, a purge treatment, or the like by inert gas such as argon gas, nitrogen gas, or the like, after a vacuum deaeration.

Further, in the polymerization reaction, the above solution is heated (warmed) up to the predetermined temperature (a temperature at which the monomer and the catalyst become activated), so that the polymerization reaction of the monomer can be carried out rapidly and reliably.

Though the heating temperature is slightly different depending on a kind of catalyst and not limited, it is preferable to be 30 to 100 degrees centigrade. In addition, in a case where the heating temperature is in the above range, the heating time (reacting time) is preferably about 10 to 20 hours.

The above polymerization reaction is preferably carried out in a reactor having an ultrasonic generator, an agitator, a reflux cooler, a dropping funnel, a temperature regulator, and a gas supply port.

Particularly, a reactor equipped with a cooling tube, a supplying mean of argon gas and an agitator is prepared, and then the first electrode 30 combining with the connecting part 4 is arranged at the bottom of the reactor. After the reactor is vacuumized and argon gas is supplied several times, a methanol solution having the monomer expressed by the formula (2) is stored in the reactor in which argon gas flows, and CuBr (catalyst) is added to the methanol solution. Then, the solution is heated up to the predetermined temperature, and kept in the temperature for the predetermined time while being agitated. Here, the agitator is preferably set to rotate at the upper position sufficiently away from the first electrode 30 in order the agitator not to break the first electrode 30.

Thus, on the surface of the first electrode 30, the polymer molecule 1 including the light absorber 2 and one end part bonded thereto grows, providing the photoelectric conversion layer 40.

(2A-3) As required, the first substrate 20 provided with the photoelectric conversion layer 40 is dried.

Drying can be performed by various methods including freeze-drying, through-flow drying, surface drying, fluidized drying, flash drying, spray drying, vacuum drying, infrared drying, high-frequency drying, ultrasonic drying, and the like. Among these methods, freeze-drying is preferably used.

Since the freeze-drying method dries a solvent by sublimating it (solid to gas), it is possible to perform drying without making almost any influence on the shape and functions of the photoelectric conversion layer 40.

(3A) Next, the second substrate 70 provided with the second electrode 60 is arranged in a manner that the second electrode 60 faces the first electrode 30 (third process), and then the outer periphery is sealed by the sealing part 80. Thus, the photoelectric conversion layer 40, the second electrode 60, and the sealing part 80 form a filling space (cell space) to be filled with electrolyte composition being a constituent of the electrolyte layer 50.

In this time, a supply port for filling electrolyte composition to the filling space is provided to the sealing part 80.

(4A) Next, after the filling space is filled with electrolyte composition via the supply port, the supply port is blocked. Accordingly, the electrolyte layer 50 is formed.

In addition, as necessary, the electrolyte composition is gelatinized. Examples of the gelatinization may include an application of heat, an application of ultraviolet rays, and the like.

(5A) Next, an end of a wiring equipped to an external circuit 90 is coupled to each of the first electrode 30 and the second electrode 60.

Through the above-described processes, the photoelectric conversion element 10 is manufactured.

Such the method for manufacturing the photoelectric conversion element 10 is suitable especially for manufacturing the photoelectric conversion element 10 used flexible substrates, of which the main material is resin, as the first substrate 20 and the second substrate 70, because each layer can be formed at relatively low temperature.

In addition, the photoelectric conversion layer 40 can be obtained also in such a method that a compound in which a thiol group is introduced to one end of the above-mentioned polymer molecule 1 is synthesized in advance, and the compound is bonded (supported) to the surface of the first electrode 30 in the above-mentioned method (for example, dipping method).

Second Embodiment

Another example of a photoelectric conversion element according to a second embodiment of the invention will now be described.

Figure 6:
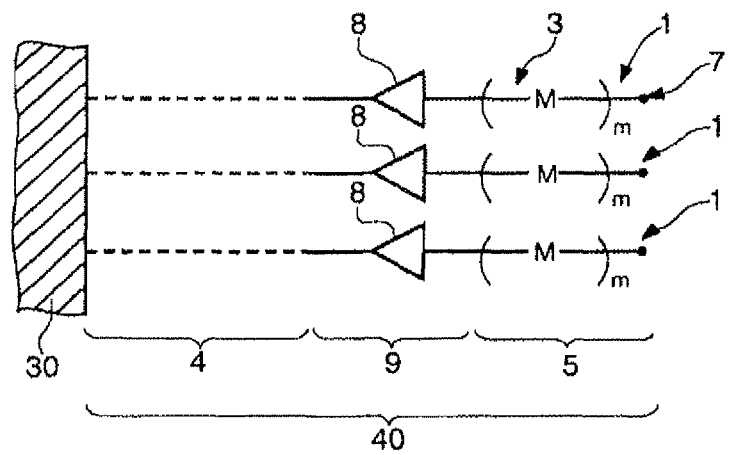
FIG. 6 is a schematic view showing another example of a photoelectric conversion layer included in a photoelectric conversion element according to the invention.
Figure 7:
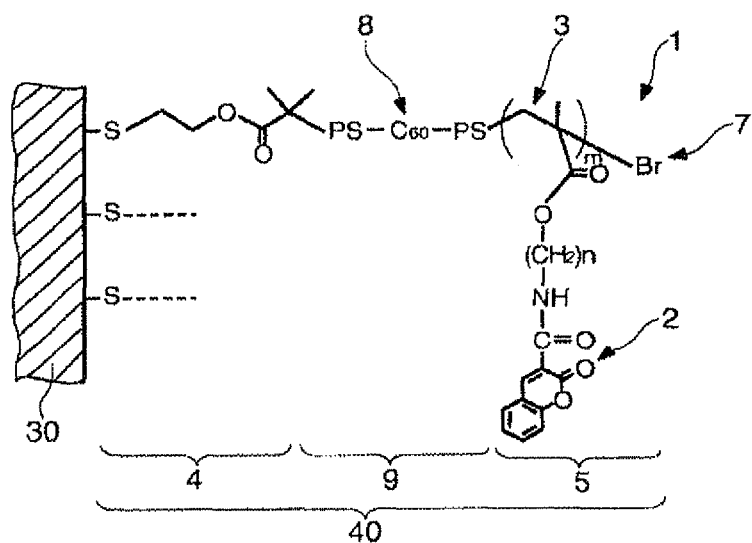
FIG. 7 is a schematic view showing an example of a photoelectric conversion layer of FIG. 6.

FIG. 6 is a schematic view of a photoelectric conversion layer included in another example of a photoelectric conversion element according to the present invention. FIG. 7 is a schematic view showing an example of the photoelectric conversion layer of FIG. 6. FIGS. 8 and 9 are schematic views illustrating another example of a method for manufacturing a photoelectric conversion element (a method for forming a photoelectric conversion layer).

The following description of the second embodiment of the photoelectric conversion element according to the invention focuses primarily on differences from the first embodiment, and similar points will be omitted.

In the second embodiment, a structure is basically same as the one in the first embodiment other than a structure of the photoelectric conversion layer 40 (a structure of the polymer molecule 1).

In the second embodiment, as shown in FIG. 6, the polymer molecule 1 is a block copolymer including a carrier transporting part 9 between the connecting part 4 and the photoelectric converting part 5, i.e. on the position closer to the first electrode 30 compared to the light absorber 2 which is the closest to the first electrode 30. The carrier transporting part 9 includes a carrier mediating part 8 which mediates a transfer of an electron (carrier) generated in the light absorber 2 to the first electrode 30.

In the polymer molecule 1 having such the structure, an electron generated in the light absorber 2 transfers to the carrier mediating part 8, and then to the first electrode 30. The electron transfers quite rapidly, thereby preferably preventing the following phenomena causing deterioration of the photoelectric conversion rate; a phenomenon in which a carrier such as an electron and the like, which transfers to the first electrode 30 once, returns to the photoelectric converting part 5; a reverse electron transfer in which a carrier generated in the photoelectric converting part 5 transfers to the second electrode 60; or the like. Therefore, an electron and an electron hole generated in the photoelectric converting part 5 are reliably separated (charge separation), so that the electron can be drawn efficiently to the first electrode 30. Accordingly, the photoelectric conversion rate of the photoelectric conversion element 10 can be further enhanced.

The carrier transporting part 9 may have a structure in which the carrier mediating part 8 is formed on a side chain branching from a main chain of the polymer molecule 1, but preferably have a structure in which the carrier mediating part 8 is formed on the main chain, as shown in FIG. 6. Therefore, an electron can transfer more rapidly and more reliably to the first electrode 30, making more reliably the above-mentioned reverse electron transfer hard to occur.

Further, the carrier transporting part 9 preferably has one carrier mediating part 8, more preferably a plurality of carrier mediating parts 8. This prevents more reliably the reverse electron transfer.

In this case, all of the carrier mediating parts 8 may be identical, or at least one of them may be different. Further, in this case, the polymer molecule 1 preferably has 2 to 20 of the carrier mediating parts 8 in its molecular structure, more preferably 3 to 10. This can improve a photoelectric conversion rate of the photoelectric conversion layer 40, accordingly.

In a case where the carrier mediating part 8 mediates the transfer of an electron, which is generated in the photoelectric converting part 5, to the first electrode 30, that is, a case where the mediating part 8 has a property as an electron acceptor, the mediating part 8 may include, but not be limited to, a fullerene (C60) skeleton, a polycyclic aromatic ring, or the like. Especially the mediating part 8 preferably includes a fullerene (C60) skeleton.

In the carrier transporting part 9, a molecular chain included in a main chain (molecular chain to be introduced together with the carrier mediating part 8) is not particularly limited and may be any molecular chain, but a molecular chain having an aromatic ring at a side chain. The aromatic ring contributes to a delocalization of an electron, like polystyrene (PS). A side chain of the carrier transporting part 9 has an aromatic ring, so that an electron transfers via the aromatic ring, and an electron (carrier) transfer rate can be prevented from declining, even if a chain length of the molecular chain is relatively lengthened.

Further, it may be advantageous that a conformation of the main chain of the carrier transporting part 9 can be controlled, because a stack structure is taken with relative ease due to an interaction between aromatic rings and the like.

Concrete examples of the polymer molecule (block copolymer) 1 having such the carrier transporting part 9 may include the one shown in FIG. 7.

The photoelectric conversion element 10 including such the photoelectric conversion layer 40 may be manufactured as follows, for example. Hereinafter, a description focuses on a method for forming the photoelectric conversion layer 40.

(1B)-(2B-1) At first, the same processes as the above processes from (1A) to (2A-1) are performed.

(2B-2) Next, the carrier transporting part 9 is formed on an end, opposite to the first electrode 30, of the connecting part 4 (first process).

Here illustrates a case where the carrier transporting part 9 has a structure in which the carrier mediating part 8 is introduced together with a molecular chain, as shown in FIG. 6.

A precursor to be the carrier mediating part 8 and a second monomer to be a molecular chain are copolymerized by living polymerization (especially, atom transfer radical polymerization: ATRP) so as to form the carrier transporting part 9 at the end, opposite to the first electrode 30, of the connecting part 4.

The living polymerization can be carried out by contacting a solution to the surface of the first electrode 30 combining with the connecting part 4. The solution includes the above-mentioned precursor, the second monomer, and a catalyst.

Examples of a polymerized group included in the second monomer may include unsaturated bonding groups such as a vinyl group, and a (meta)acrylyl group; cyclic ether groups such as a epoxy group, and an oxetane ring; and the like. The second monomer may be selected appropriately depending on a desired characteristic, a reaction condition or the like. In addition, as mentioned above, the molecular chain preferably has an aromatic ring on its side chain. In view of it, styrene is preferable for the second monomer.

As a solvent for preparing a catalyst and the above solution, the same solvent as the one cited in the first embodiment may be used.

For example, by using fullerene as a precursor to be the carrier mediating part 8, styrene as the second monomer to be the molecular chain, and CuBr as the catalyst, a polymerization reaction of the second monomer progresses while taking the precursor in, being able to form the carrier transporting part 9 including a growth end 7' being active at the end part opposite to the first electrode 30, as shown in FIG. 8.

Further, the above solution (reaction liquid) is preferably deoxidized before the polymerization reaction starts. Examples of deoxidizations may include a substitution, a purge treatment, or the like by inert gas such as argon gas, nitrogen gas, or the like, after a vacuum deaeration.

Further, in the polymerization reaction, the above solution is heated (warmed) up to the predetermined temperature (a temperature at which the second monomer and the catalyst become activated), so that the polymerization reaction of the second monomer can be carried out more rapidly and more reliably.

The heating temperature is slightly different depending on a kind of catalyst and is not limited, but it is preferable to be 60 to 90 degrees centigrade. In addition, in a case where the heating temperature is in the above range, the heating time (reacting time) is preferably about 20 to 50 hours.

The above polymerization reaction is preferably carried out in a reactor having an ultrasonic generator, an agitator, a reflux cooler, a dropping funnel, a temperature regulator, and a gas supply port.

Particularly, a reactor equipped with a cooling tube, a supplying mean of nitrogen gas and an agitator is prepared, and then the first electrode 30 combining with the connecting part 4 is arranged at the bottom of the reactor. After the reactor is vacuumized and nitrogen gas is supplied several times, styrene (the second monomer) and o-dichlorobenzene solution of fullerene (C60) are stored and mixed in the reactor in a manner that the nitrogen gas flows therein, and CuBr (catalyst) is added to the mixed liquid. Then, the mixed liquid is heated up to the predetermined temperature, and kept in the temperature for the predetermined time while being agitated. Here, the agitator preferably rotates at the upper position sufficiently away from the first electrode 30 in order the agitator not to break the first electrode 30.

(2B-3) Next, the same process as the above process (2A-2) is performed. That is, the photoelectric converting part 5 is provided to the end, opposite to the first electrode 30, of the carrier transporting part 9 (second process).

For example, by using a compound expressed in the formula (2) as a monomer, and CuBr as a catalyst, the photoelectric converting part 5 having a growth end 7 being active can be provided to the end part opposite to the first electrode 30, as shown in FIG. 9. This process provides (synthesizes) the polymer molecule 1.

(2B-4)-(5B) The same processes as the above processes (2A-3) to (5A) are performed.

Here, in the polymer molecule 1 of the second embodiment, the carrier transporting part 9 may be given a function as a photoelectric converting part which can absorb light and generate a carrier by itself.

Electronic Apparatus

Figure 10:
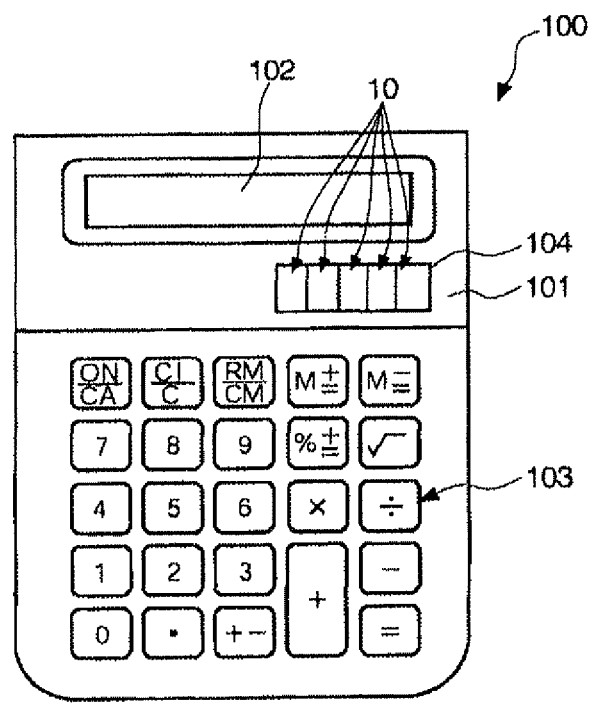
FIG. 10 is a plan view showing a calculator.
Figure 11:
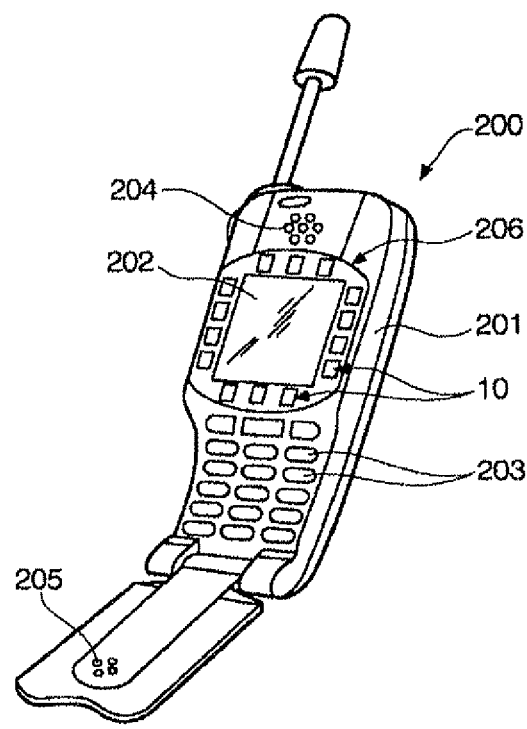
FIG. 11 is a perspective view showing a cellular phone (including a personal handyphone system: PHS).

Referring now to FIGS. 10 and 11, an electronic apparatus according to the invention will be described.

FIG. 10 is a plan view showing a calculator to which the electronic apparatus according to the invention is applied. FIG. 11 is a perspective view showing a cellular phone (including a personal handyphone system as well) to which the electronic apparatus according to the invention is applied.

A calculator 100 shown in FIG. 10 includes a body 101, a display 102 on the upper (front) surface of the body 101, a plurality of operation buttons 103, and a photoelectric conversion element unit 104.

In the structure shown in FIG. 10, five photoelectric conversion elements 10 are arranged tandemly in the photoelectric conversion element unit 104.

A cellular phone 200 shown in FIG. 11 includes a body 201, a display 202 on the front surface of the body 201, a plurality of operation buttons 203, an earpiece 204, a mouthpiece 205, and a photoelectric conversion element unit 206.

In the structure shown in Fig, 11, a plurality of photoelectric conversion elements 10 are arranged tandemly in a manner that they surround the display 202 in the photoelectric conversion element unit 206.

While the embodiments of the photoelectric conversion element, the method for manufacturing a photoelectric conversion element, and the electronic apparatus according to the invention are described herein, the invention is not limited to these embodiments.

For example, each element of the photoelectric conversion element and the electronic apparatus may be replaced with any other elements having similar functions.

The photoelectric conversion element according to the invention is not limited to solar cells, and is also applicable to various elements (light-receiving elements) that receive and convert light into electrical energy, such as optical sensors and switches.

Furthermore, light may be incident on the photoelectric conversion element according to the invention in a reverse direction, which is different from the direction shown in the drawings. In other words, light may be incident in any direction.

What is claimed is:

1. A photoelectric conversion polymer for a photoelectric conversion element, comprising:
    a light absorber that generates a carrier by absorbing a light; and
    a carrier mediating part that mediates a first transfer of the carrier to a first electrode, wherein:
    the light absorber being included in a side chain of the photoelectric conversion polymer,
    the carrier mediating part being included in a main chain of the photoelectric conversion polymer, and
    the main chain connecting to the first electrode or a connecting part to the first electrode.

2. The photoelectric conversion polymer for a photoelectric conversion element according to claim 1, the carrier mediating part including a fullerene.

3. The photoelectric conversion polymer for a photoelectric conversion element according to claim 1,
    the photoelectric conversion polymer connecting to a connecting part to the first electrode, and a number of carbon of the connecting part being 2 to 25.

4. A photoelectric conversion element, comprising:
    the photoelectric conversion polymer according to claim 1;
    the first electrode;
    a second electrode;
    an electrolyte disposed between the photoelectric conversion polymer and the second electrode,
    the photoelectric conversion polymer being disposed between the first electrode and the second electrode.

5. The photoelectric conversion element according to claim 4, an amount of the photoelectric conversion polymer being 0.2 to 3.0 nmol/cm$^2$.

6. An electronic apparatus, comprising:
    the photoelectric conversion polymer according to claim 1.

7. An electronic apparatus, comprising:
    the photoelectric conversion polymer according to claim 2.

8. An electronic apparatus, comprising:
    the photoelectric conversion polymer according to claim 3.

9. An electronic apparatus, comprising:
    the photoelectric conversion element according to claim 4.

10. An electronic apparatus, comprising:
    the photoelectric conversion element according to claim 5.

11. The photoelectric conversion polymer for a photoelectric conversion element according to claim 1, wherein a second transfer of the carrier opposite to the first transfer of the carrier is suppressed.

12. The photoelectric conversion polymer for a photoelectric conversion element according to claim 11, wherein the photoelectric conversion polymer suppresses the second transfer.

13. The photoelectric conversion polymer for a photoelectric conversion element according to claim 1, wherein a second transfer of the carrier from the first electrode to the light absorber is suppressed.

14. The photoelectric conversion polymer for a photoelectric conversion element according to claim 1, further comprising:
    an aromatic ring.

15. The photoelectric conversion polymer for a photoelectric conversion element according to claim 1, further comprising:
    a block co-polymer.

16. The photoelectric conversion polymer for a photoelectric conversion element according to claim 1, the carrier mediating part having an electron accepting moiety.

* * * * *